United States Patent
Sunda et al.

(10) Patent No.: US 11,145,513 B2
(45) Date of Patent: Oct. 12, 2021

(54) METHOD OF MANUFACTURING SEMICONDUCTOR DEVICE

(71) Applicant: NICHIA CORPORATION, Anan (JP)

(72) Inventors: Takamasa Sunda, Tokushima (JP); Yoshinori Fukui, Tokushima (JP); Shinya Asakawa, Anan (JP)

(73) Assignee: NICHIA CORPORATION, Anan (JP)

( * ) Notice: Subject to any disclaimer, the term of this patent is extended or adjusted under 35 U.S.C. 154(b) by 121 days.

(21) Appl. No.: 16/580,945

(22) Filed: Sep. 24, 2019

(65) Prior Publication Data

US 2020/0098568 A1  Mar. 26, 2020

(30) Foreign Application Priority Data

Sep. 25, 2018  (JP) .............................. JP2018-178777

(51) Int. Cl.
| | | |
|---|---|---|
| *H01L 21/228* | (2006.01) | |
| *C25D 5/02* | (2006.01) | |
| *H01L 21/288* | (2006.01) | |
| *H01L 23/00* | (2006.01) | |
| *C25D 3/38* | (2006.01) | |
| *C25D 7/12* | (2006.01) | |

(52) U.S. Cl.
CPC ............ *H01L 21/2885* (2013.01); *C25D 3/38* (2013.01); *C25D 5/022* (2013.01); *C25D 7/12* (2013.01); *H01L 24/13* (2013.01); *H01L 2224/11462* (2013.01)

(58) Field of Classification Search
None
See application file for complete search history.

(56) References Cited

U.S. PATENT DOCUMENTS

| | | |
|---|---|---|
| 2004/0172813 A1 | 9/2004 | Matsui |
| 2005/0040543 A1 | 2/2005 | Watanabe |
| 2009/0283413 A1 | 11/2009 | Sato |
| 2010/0330796 A1 | 12/2010 | Okaji |
| 2017/0278813 A1 | 9/2017 | Wakuda et al. |
| 2017/0358545 A1* | 12/2017 | Choi ....................... H01L 24/05 |

FOREIGN PATENT DOCUMENTS

| | | |
|---|---|---|
| JP | H05-218047 A | 8/1993 |
| JP | 2004-207317 A | 7/2004 |
| JP | 2005-064473 A | 3/2005 |
| JP | 2007-100130 A | 4/2007 |
| JP | 2009-277772 A | 11/2009 |
| JP | 2010-205799 A | 9/2010 |
| JP | 2011-014607 A | 1/2011 |
| JP | 2013-033893 A | 2/2013 |
| JP | 2014-157906 A | 8/2014 |
| JP | 2016-086044 A | 5/2016 |
| JP | 2017-183332 A | 10/2017 |

* cited by examiner

*Primary Examiner* — Wojciech Haske
(74) *Attorney, Agent, or Firm* — Foley & Lardner LLP

(57) ABSTRACT

A method of manufacturing a semiconductor device includes forming a photoresist defining an opening on an upper surface of a semiconductor wafer; and forming an electrode in the opening using a plating technique, in which the step of forming the electrode includes forming a first plated layer at a first current density such that the first plated layer has a first thickness, and forming a second plated layer on an upper surface of the first plated layer at a second current density higher than the first current density such that the second plated layer has a second thickness greater than the first thickness.

12 Claims, 4 Drawing Sheets

METHOD OF MANUFACTURING SEMICONDUCTOR DEVICE

CROSS-REFERENCE TO RELATED APPLICATIONS

This application claims priority to Japanese Patent Application No. 2018-178777, filed on Sep. 25, 2018, the entire contents of which are incorporated herein by reference.

TECHNICAL FIELD

The present disclosure relates to a method of manufacturing a semiconductor device.

BACKGROUND

There is a constant demand for further miniaturization of semiconductor devices used in electronic devices along with the miniaturization and weight reduction of the electronic devices. Semiconductor devices are generally required to be provided with an electrode for mounting and the like, such as a post electrode 407 described in Japanese Patent Application Laid-open No. 2005-64473. Such an electrode is generally formed using a plating technique in an opening of a photoresist formed on an upper surface of a semiconductor wafer.

SUMMARY

When a size of openings defined in a photoresist is reduced, a plating solution used for forming a plated layer may not sufficiently penetrate into the opening, which causes variation in plating growth. Accordingly, an electrode may not be formed to have a desired shape, and, for example, a depression may be generated in an upper surface of the plated layer, so that flatness of the electrode may not be secured. This may result in failure of stable mounting of a semiconductor device in which the plated layer is formed as an electrode at which mounting is performed.

According to the present disclosure, a method of manufacturing a semiconductor device allows for stably forming an electrode with a desired shape even when using a photoresist defining openings with a reduced size.

According to one embodiment, a method of manufacturing a semiconductor device includes: forming a photoresist defining an opening on an upper surface of a semiconductor wafer; and forming an electrode in the opening using a plating technique, in which the step of forming an electrode includes forming a first plated layer at a first current density such that the first plated layer has a first thickness, and forming a second plated layer on an upper surface of the first plated layer at a second current density higher than the first current density such that the second plated layer has a second thickness greater than the first thickness.

The manufacturing method according to certain embodiments of the present invention allows for stably forming an electrode of a desired shape even when using a photoresist having openings with a reduced size.

DETAILED DESCRIPTION

Hereinafter, certain embodiments of the present invention will be described with reference to the drawings.

Figure 1:
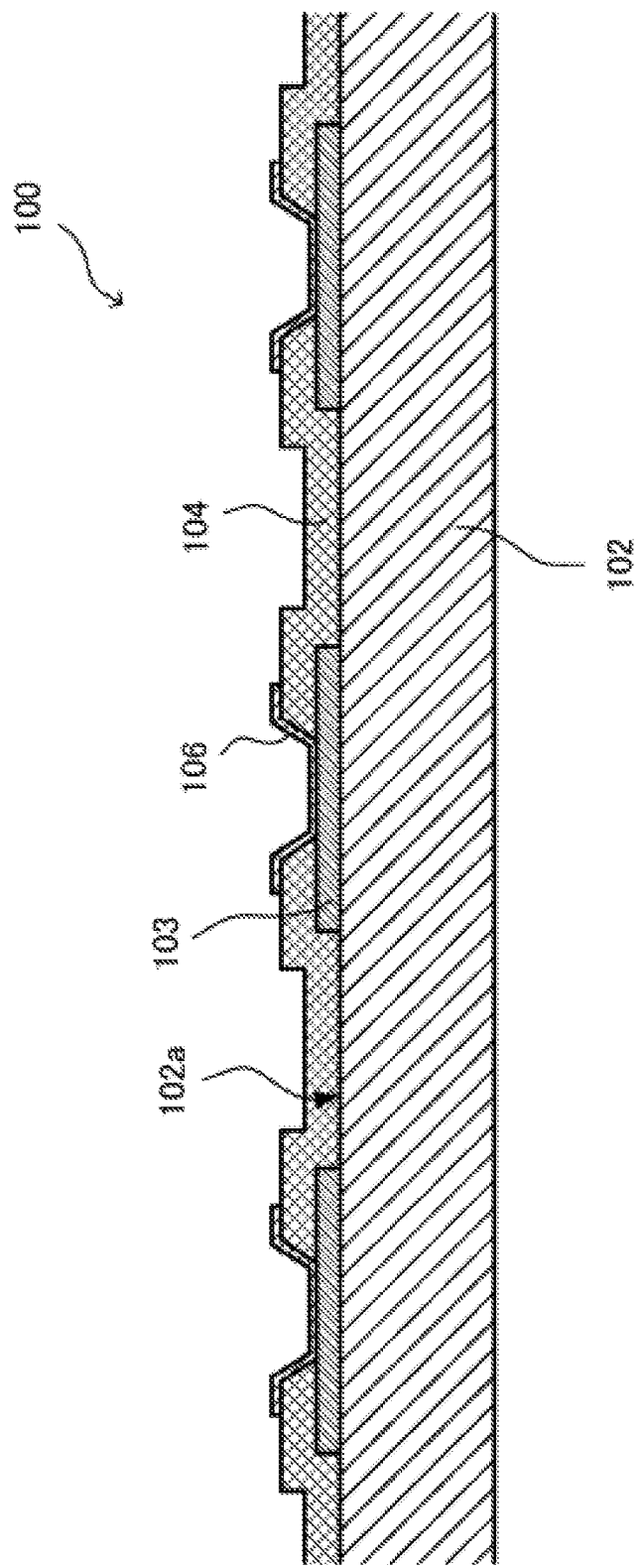
FIG. 1 is a cross-sectional view schematically showing a semiconductor wafer used in one embodiment of a method of manufacturing a semiconductor device.
Figure 2:
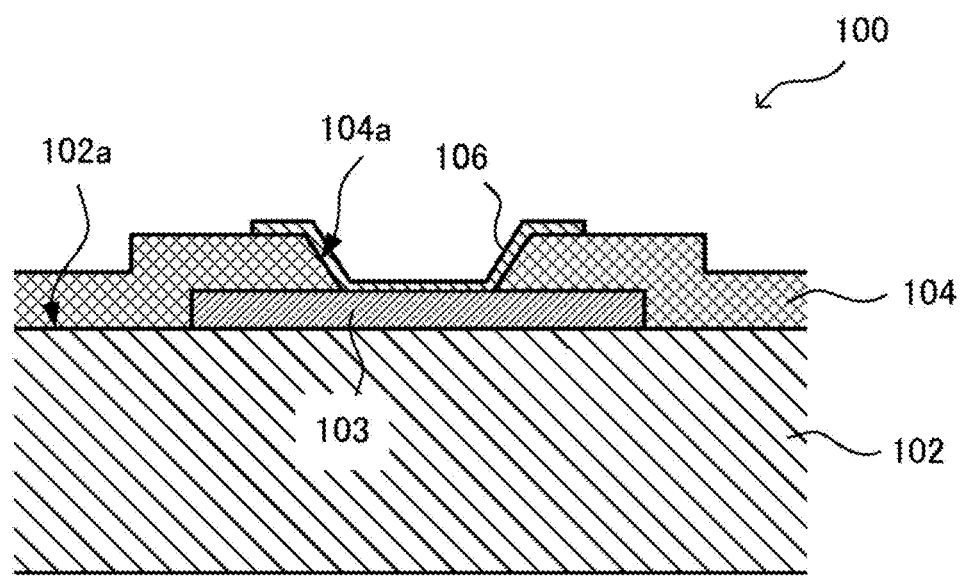
FIG. 2 is an enlarged local view of the semiconductor wafer shown in FIG. 1.

FIG. 1 is a cross-sectional view schematically showing a semiconductor wafer used in an embodiment of a method of manufacturing a semiconductor device. FIG. 2 is an enlarged local view of the semiconductor wafer shown in FIG. 1. A semiconductor wafer 100 includes a substrate 102, a plurality of semiconductor elements 103, an insulating layer 104, and a conductive layer 106. The plurality of semiconductor elements 103 are disposed on a surface 102a of the substrate 102 as shown in FIG. 1. The insulating layer 104 defining openings 104a is disposed on the semiconductor elements 103. The conductive layer 106 is disposed over the opening 104a and is electrically connected to each of the semiconductor elements 103 on the surface 102a of the substrate 102. Examples of the semiconductor elements 103 include a semiconductor element having a semiconductor structure in which a plurality of nitride semiconductor layers are stacked.

The method of manufacturing according to the present embodiment includes a photoresist forming step and an electrode forming step.

Figure 3:
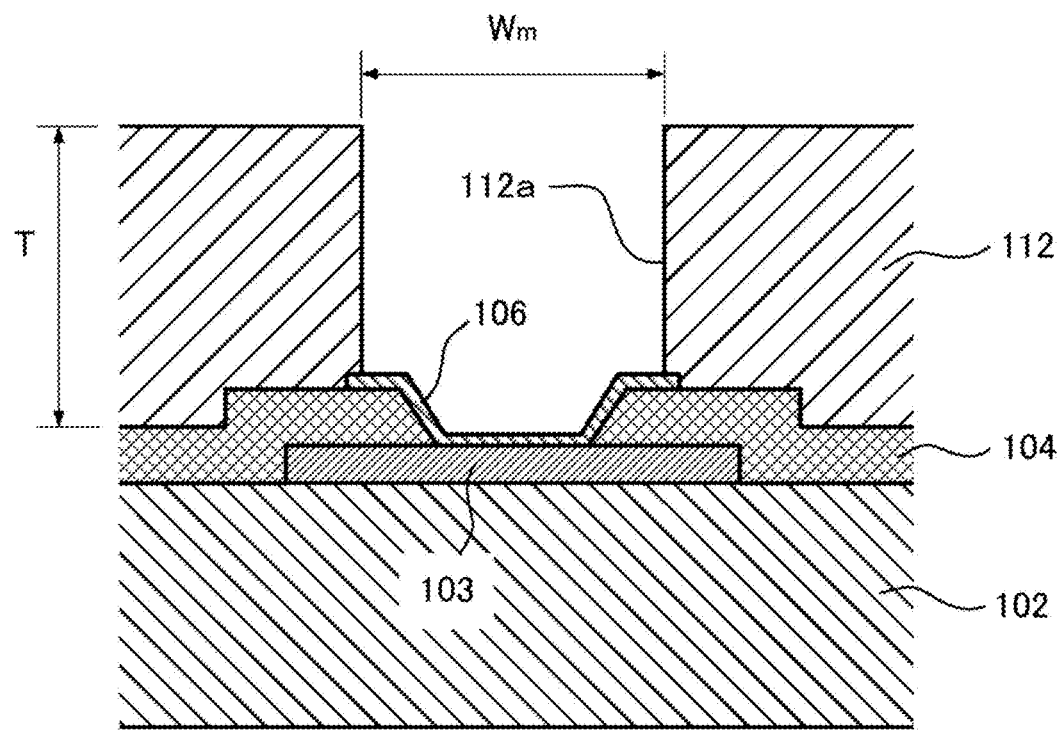
FIG. 3 is a cross-sectional view schematically showing a state in which a photoresist having an opening is formed on a semiconductor wafer.

FIG. 3 is a cross-sectional view schematically showing a state in which a photoresist defining an opening is formed on a semiconductor wafer. As shown in FIG. 3, in the photoresist forming step, a photoresist 112 having an opening 112a is formed on an upper surface of the semiconductor wafer 100. The photoresist 112 is formed using a photolithography method so that the opening 112a is formed on the conductive layer 106. For further miniaturization of a semiconductor device, a thickness T of the photoresist 112 can be, for example, in a range of 50 µm to 70 µm. In addition, a maximum width Wm of the opening 112a in a plan view is, for example, 100 µm or less. When the opening 112a has a circular shape in a plan view, the maximum width Wm corresponds to a diameter of the circle.

The thickness T of the photoresist 112 and the maximum width Wm of the opening 112a can be appropriately adjusted according to a shape of an electrode 120 to be formed. When the electrode 120 is formed using a plating technique with the photoresist 112 having the thickness T in a range of 50 µm to 70 µm and defining the openings 112a with the maximum width Wm of 100 µm or less, flatness of an upper surface of the electrode 120 tends to be reduced. With the manufacturing method according to the present embodiment, even when a thickness of the photoresist 112 is increased and the size of the opening 112a is relatively small, the electrode 120 having an upper surface with a high flatness can be formed.

In the electrode forming step, an electrode is formed in the opening 112a using a plating technique. The electrode forming step includes forming a first plated layer and forming a second plated layer. A first plated layer 122 and a second plated layer 124 are preferably made of the same metal material. Accordingly, manufacturing steps can be simplified. The first plated layer 122 and the second plated layer 124 is made of, for example, copper. The electrode 120 can serve as an electrode for external connection when the semiconductor device is mounted to a mounting substrate or the like.

Figure 4:
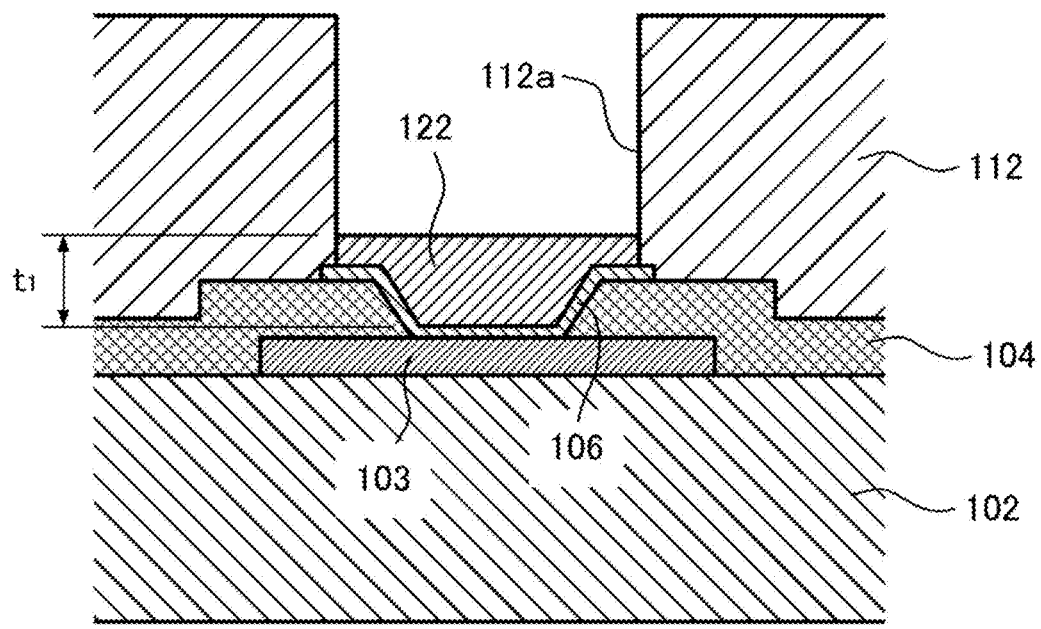
FIG. 4 is a cross-sectional view schematically showing a state in which a first plated layer is formed.

FIG. 4 is a cross-sectional view schematically showing a state in which the first plated layer 122 is formed. In the step of forming a first plated layer, the first plated layer 122 having a first thickness $t_1$ is formed at a first current density. The first current density is preferably 0.1 mA/mm$^2$ to 0.7 mA/mm$^2$, more preferably 0.1 mA/mm$^2$ to 0.3 mA/mm$^2$, and even more preferably 0.1 mA/mm$^2$ to 0.2 mA/mm$^2$. With the first current density of 0.7 mA/mm$^2$ or less, deterioration of flatness of the upper surface of the first plated layer can be reduced. Meanwhile, with an excessively low current density, growth speed of a plated layer may be reduced, resulting in reduction in productivity. With the first current density of 0.1 mA/mm$^2$ or more, the first plated layer having an upper surface with high flatness can be formed without reducing productivity.

Figure 5:
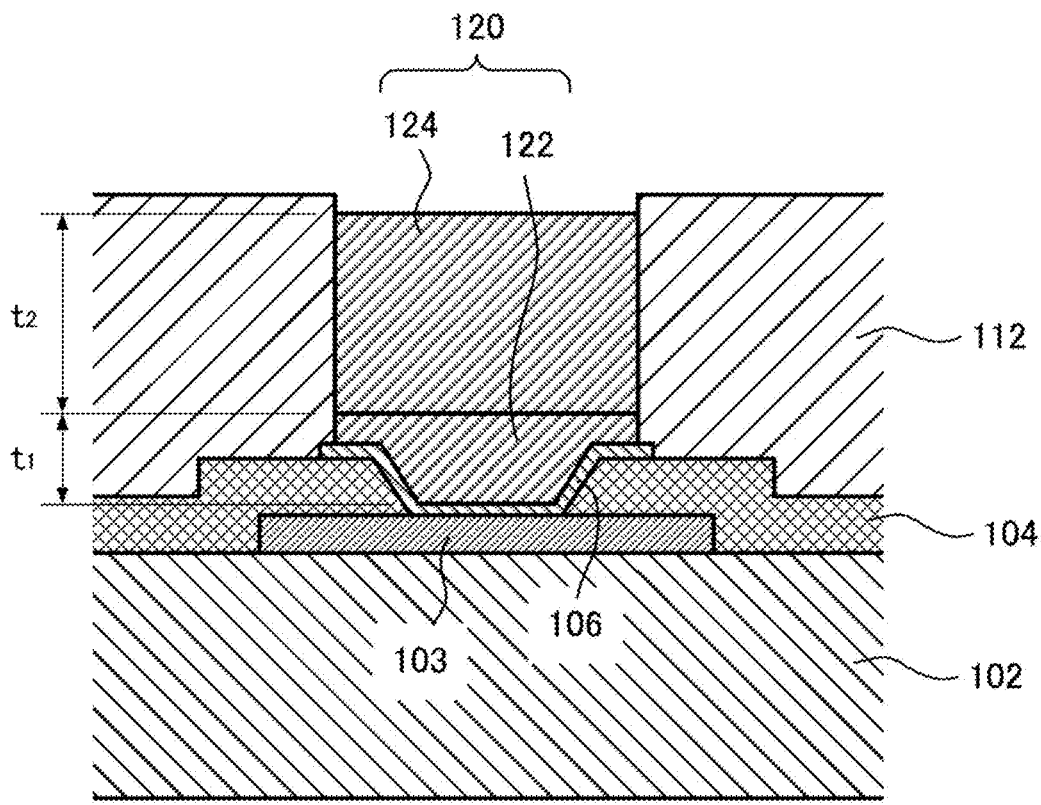
FIG. 5 is a cross-sectional view schematically showing a state in which a second plated layer is formed.

FIG. 5 is a cross-sectional view schematically showing a state in which a second plated layer 124 is formed. In the step of forming a second plated layer, the second plated layer 124 having a second thickness $t_2$ is formed on an upper surface of the first plated layer 122 at a second current density. The second thickness $t_2$ is greater than the first thickness $t_1$. By this process, the electrode 120 is formed. The second current density is higher than the first current density. The second current density is preferably in a range of 0.8 mA/mm$^2$ to 2.0 mA/mm$^2$, more preferably in a range of 0.8 mA/mm$^2$ to 1.2 mA/mm$^2$, and even more preferably in a range of 0.8 mA/mm$^2$ to 1.0 mA/mm$^2$. With the second current density of 2.0 mA/mm$^2$ or less, reduction in flatness of the upper surface of the second plated layer can be reduced. With the second current density of 0.8 mA/mm$^2$ or more, growth speed can be increased as compared to the first current density, and processing time for forming the desired electrode 120 can be reduced.

The second thickness $t_2$ is preferably three to five times as large as the first thickness $t_1$. For example, when forming the electrode 120 with a thickness of 50 μm, the first thickness $t_1$ is approximately 10 μm and the second thickness $t_2$ is approximately 40 μm. With the second thickness $t_2$ three times or more as large as the first thickness $t_1$, processing time for forming the desired electrode 120 can be reduced. With the second thickness $t_2$ five times or less as large as the first thickness $t_1$, processing time for forming the desired electrode 120 can be further reduced, and reduction of flatness of the upper surface of the second plated layer can be reduced. After the electrode forming step, the photoresist 112 formed on the upper surface of the semiconductor wafer 100 is removed.

According to a study carried out by the inventors, performing plating at a relatively low current density, such as the first current density, to reduce speed of growth of a plated layer allows for forming a plated layer having an upper surface with high flatness in the opening 112a even in a case in which a size of the opening 112a is reduced for miniaturizing the semiconductor device. On the other hand, the higher the current density in the plating process is, the faster the growth speed of a plated layer can be, while the lower the flatness of the upper surface of the plated layer is. Forming a plated layer at a relatively high current density, such as the second current density, causes a depression in the upper surface of the plated layer, so that flatness is reduced. It is thought that, by increasing the growth speed, plating growth proceeds in a state in which a plating solution used for plating growth is not sufficiently supplied into the opening 112a, causing variation in growth of a plated layer formed in the opening 112a in an initial stage. Advancement in growth of the plated layer with the variation in growth of the plated layer is considered to result in reduction in flatness of the upper surface of the formed plated layer.

However, according to study carried out by the inventors, forming the first plated layer 122 at a first current density and then forming the second plated layer 124 at a second current density on the first plated layer 122 such that the first current density is a relatively low current density and the second current density is a relatively high current density prevented reduction in flatness of the upper surface of the second plated layer 124. This is thought to be due to that forming the first plated layer 122 such that the first plated layer 122 has an upper surface with high flatness in the step of forming the first plated layer and growing the second plated layer 124 on the first plated layer 122 serving as a base allows for forming the second plated layer 124 having an upper surface with good flatness without variation in the growth of the plated layers, even at the second current density, which is relatively high current density.

In the method of manufacturing according to the present embodiment, after forming the first plated layer with the first thickness $t_1$ at the first current density, the second plated layer 124 having the second thickness $t_2$ is formed at the second current density, which is higher in current density and faster in growth speed than those of the first current density, such that the second thickness $t_2$ is greater than the first thickness $t_1$. Accordingly, even when the size of the opening 112a is relatively small, an electrode having an upper surface with good flatness can be formed while reducing time for the plating process.

EXAMPLES

A photoresist pattern having a plurality of openings arranged at regular intervals was formed on each semiconductor wafer, and electrodes were formed under different plating conditions for each semiconductor wafer. Further, conditions for forming electrodes were compared between semiconductor wafers with respect to the depression occurrence ratios. The "depression occurrence ratio" as used herein refers to a ratio of electrodes having an upper surface with a depression on each semiconductor wafer. A photoresist had a thickness of 65 μm. The photoresist had an opening having a circular shape in a plan view with a diameter of approximately 80 μm. An electrode is formed using a plating technique. The electrode had a circular shape in a plan view with a diameter of approximately 80 μm and a thickness of 55 μm. The electrode was formed using copper.

Table 1 shows a result of a comparison of depression occurrence ratios between electrodes formed under different plating conditions. Sample 3 is an example in which an electrode was formed under the conditions described above. On the other hand, Sample 1 and Sample 2 are comparative examples for comparison with Sample 3.

TABLE 1

| Electrode structure of sample | | Current density mA/mm² | Film thickness μm | Processing time | Upper surface depression occurrence rate % |
|---|---|---|---|---|---|
| Sample 1 (one-stage film formation) | Plated layer | 0.2 | 85 | 123 min. 45 sec. | 0.0 |
| Sample 2 (one-stage film formation) | Plated layer | 0.8 | 65 | 30 min. 36 sec. | 81.0 |
| Sample 3 (two-stage film formation) | First plated layer | 0.2 | 10 | 22 min. 20 sec. | 8.0 |
| | Second plated layer | 0.8 | 45 | 25 min. 19 sec. | |

Sample 1 was a sample in which a plated layer, which becomes an electrode, was formed at a constant current density. Such a film formation process will be referred to herein as "one-stage film formation" for the sake of convenience. The current density for forming the plating layer in Sample 1 was 0.2 mA/mm². An upper surface of a plated layer formed at this current density had good flatness with a depression occurrence rate of 0.0%. However, a growth speed of a plated layer was low and a processing time for forming a plated layer with a thickness of 55 μm was 123 minutes and 45 seconds.

Sample 2 was a sample in which a plated layer, which becomes an electrode, was formed by one-stage film formation at a constant current density as in Sample 1. However, the current density for forming the plating layer in Sample 2 was 0.8 mA/mm², which is a higher current density than that for forming the plating layer in Sample 1. When a plated layer in Sample 2 was formed at this current density, a growth speed of a plated layer increased and a processing time for forming a plated layer with a thickness of 55 μm was reduced to 30 minutes and 56 seconds. However, flatness of an upper surface of a plated layer was poor and a depression occurrence ratio was 81.0%.

Figure 6:
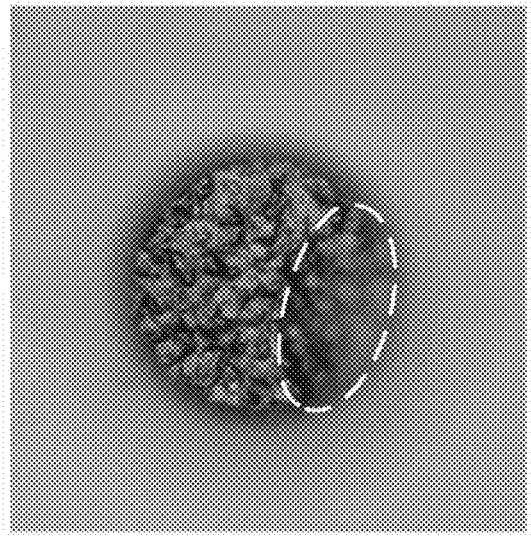
FIG. 6 is a micrograph of an upper surface of one of electrodes (i.e., plated layer) in Sample 2.

FIG. 6 is a micrograph of an upper surface of one electrode (i.e., plated layer) in Sample 2. A depression occurred in a portion enclosed by a dashed line, which is out of focus of the microscope and shown as a blur in the image. When an electrode is formed under plating conditions such as Sample 2, a depression is likely to occur in the upper surface of the electrode, so that mounting may not be performed stably.

Sample 3 is a sample in which a plated layer, which becomes an electrode, was formed by dividing a plating process into two stages. Such a film formation process will be referred to herein as "two-stage film formation." In a first stage, a first plated layer with a first thickness of 10 μm was formed at a first current density of 0.2 mA/mm². Formation of the first plated layer took 22 minutes and 30 seconds. In a second stage, a second plated layer with a second thickness of 45 μm was formed on the first plated layer at a second current density of 0.8 mA/mm². Formation of the second plated layer took 25 minutes and 19 seconds. A total thickness of the electrode according to Sample 3 was 55 μm and a total time for forming the electrode was 47 minutes and 49 seconds.

Figure 7:
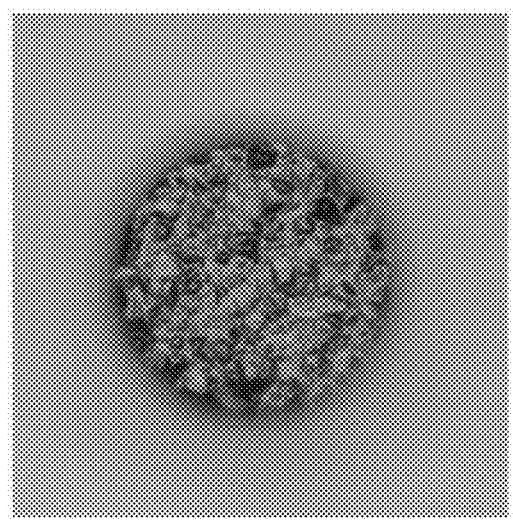
FIG. 7 is a micrograph of an upper surface of one of electrodes (i.e., plated layer) in Sample 3.

FIG. 7 is a micrograph of an upper surface of one electrode (plated layer) in Sample 3. A blurred portion such as that in Sample 2 in FIG. 6 is not shown in the upper surface of the electrode in FIG. 7, which indicates that no depression was generated on the upper surface of the electrode in Sample 3. In Sample 3, the upper surface of the plated layer, which becomes an electrode, had good flatness. A depression occurrence rate in Sample 3 was 0.0%, which is the same as that of Sample 1. Processing time for forming electrode in Sample 3 was half or less of that of Sample 1.

According to these examples, when a plated layer is formed at a relatively low current density, an electrode having an upper surface with good flatness can be formed in an opening of a photoresist with a small width (i.e., diameter), but the time required for a plating process increases. In the method of manufacturing according to the present disclosure, the plating process is performed in two stages, in which a first plated layer is formed at a first current density to have a first thickness, and a second plated layer is formed at a second current density to have a second thickness on an upper surface of the first plated layer, such that the first thickness is relatively small, the first current density is relatively low current density, the second thickness is greater than the first thickness, and the second current density is relatively high current density. This allows for forming an electrode having an upper surface with high flatness can be obtained while the time required for a plating process is greatly reduced.

In the present specification, expressions used for indicating an orientation, a position, or the like of a component, such as "upper" and "lower" in expressions such as "upper surface" described above, generally represent a relative orientation, position, or the like among components in a cross-sectional view and are not intended to indicate an absolute position unless otherwise stated.

While certain embodiments of the present invention have been described above, it is to be understood that the technical scope of the present invention is not limited to the scope of the embodiments described above. It will be obvious to those skilled in the art that various changes and modifications can be made to the embodiments described above. It will also be obvious from the appended claims that modes incorporating such changes and modifications may also be included in the technical scope of the present invention.

For example, the embodiment described above has been described in detail to facilitate understanding of the invention, and the present invention is not necessarily limited to modes that include all of the components described above. In each embodiment, some components may be replaced by other components or may not be included.

What is claimed is:

1. A method of manufacturing a semiconductor device, the method comprising:
   providing a semiconductor wafer comprising:
      a substrate,
      a semiconductor element disposed on an upper surface of the substrate,
      an insulating layer disposed on the upper surface of the substrate and defining a first opening located above the semiconductor element, and
      a conductive layer disposed on the semiconductor element in the first opening;
   forming a photoresist on the upper surface of the semiconductor wafer, wherein the photoresist defines a second opening above the first opening, and wherein, in a plan view, a maximum width of the second opening is larger than a maximum width of the first opening; and
   forming an electrode in the first opening and the second opening using a plating technique, wherein the step of forming the electrode comprises:

forming a first plated layer at a first current density, such that the first plated layer has a first thickness, and such that an upper surface of the first plated layer is substantially planar in an entirety of the second opening, and forming a second plated layer on an upper surface of the first plated layer at a second current density higher than the first current density such that the second plated layer has a second thickness greater than the first thickness.

2. The method of manufacturing a semiconductor device according to claim 1, wherein:

the photoresist has a thickness of 50 μm to 70 μm, and the maximum width of the second opening in the plan view is 100 μm or less.

3. The method of manufacturing a semiconductor device according to claim 2, wherein:

the first plated layer and the second plated layer comprise copper.

4. The method of manufacturing a semiconductor device according to claim 2, wherein:

the first current density is in a range of 0.1 mA/mm$^2$ to 0.7 mA/mm$^2$ and the second current density is in a range of 0.8 mA/mm$^2$ to 2.0 mA/mm$^2$.

5. The method of manufacturing a semiconductor device according to claim 4, wherein:

the second thickness is in a range of three times to five times as large as the first thickness.

6. The method of manufacturing a semiconductor device according to claim 2, wherein:

the second thickness is in a range of three times to five times as large as the first thickness.

7. The method of manufacturing a semiconductor device according to claim 1, wherein:

the first plated layer and the second plated layer comprise copper.

8. The method of manufacturing a semiconductor device according to claim 7, wherein:

the first current density is in a range of 0.1 mA/mm$^2$ to 0.7 mA/mm$^2$ and the second current density is in a range of 0.8 mA/mm$^2$ to 2.0 mA/mm$^2$.

9. The method of manufacturing a semiconductor device according to claim 7, wherein:

the second thickness is in a range of three times to five times as large as the first thickness.

10. The method of manufacturing a semiconductor device according to claim 1, wherein:

the first current density is in a range of 0.1 mA/mm$^2$ to 0.7 mA/mm$^2$ and the second current density is in a range of 0.8 mA/mm$^2$ to 2.0 mA/mm$^2$.

11. The method of manufacturing a semiconductor device according to claim 1, wherein:

the second thickness is in a range of three times to five times as large as the first thickness.

12. The method of manufacturing a semiconductor device according to claim 1, wherein, in the step of forming the photoresist, the photoresist is formed in direct contact with an upper surface of the insulating layer.

* * * * *